(12) United States Patent
Petras et al.

(10) Patent No.: US 10,811,216 B2
(45) Date of Patent: Oct. 20, 2020

(54) METHOD FOR AUTOMATICALLY ALIGNING A SCANNING TRANSMISSION ELECTRON MICROSCOPE FOR PRECESSION ELECTRON DIFFRACTION DATA MAPPING

(71) Applicants: TESCAN BRNO s.r.o., Brno (CZ); TESCAN TEMPE, LLC, Tempe, AZ (US)

(72) Inventors: Stanislav Petras, Strakonice (CZ); Bohumila Lencova, Kurim (CZ); Gerd Ludwig Benner, Aalen (DE); Jon Karl Weiss, Tempe, AZ (US)

(73) Assignees: TESCAN BRNO s.r.o, Brno (CZ); TESCAN TEMPE, LLC, Tempe, AZ (US)

( * ) Notice: Subject to any disclaimer, the term of this patent is extended or adjusted under 35 U.S.C. 154(b) by 48 days.

(21) Appl. No.: 16/359,231

(22) Filed: Mar. 20, 2019

(65) Prior Publication Data

US 2019/0295810 A1    Sep. 26, 2019

Related U.S. Application Data

(60) Provisional application No. 62/645,378, filed on Mar. 20, 2018.

(51) Int. Cl.
*H01J 37/26* (2006.01)
*H01J 37/147* (2006.01)
(Continued)

(52) U.S. Cl.
CPC .... *H01J 37/1471* (2013.01); *G01N 23/20058* (2013.01); *H01J 37/28* (2013.01); *H01J 2237/2802* (2013.01)

(58) Field of Classification Search
CPC .............. H01J 37/1471; H01J 37/26; H01J 2237/2802; G01N 23/20058
See application file for complete search history.

(56) References Cited

U.S. PATENT DOCUMENTS

| 8,253,099 B2 | 8/2012 | Nicolopoulos et al. |
| 2011/0049363 A1* | 3/2011 | Koch ............ H01J 37/26 250/307 |
| 2019/0155218 A1* | 5/2019 | Boureau ............ G03H 1/0402 |

FOREIGN PATENT DOCUMENTS

| EP | 2642279 A1 | 9/2013 |
| WO | 2017087045 A1 | 5/2017 |

OTHER PUBLICATIONS

Barnard, Jonathan S. et al.; "High-resolution scanning precession electron diffraction: Alignment and spatial resolution", Ultramicroscopy, vol. 174, Dec. 25, 2016, pp. 79-88, © 2016 Elsevier B.V.
Koch, Cristoph T.; "Aberration-compensated large-angle rocking-beam electron diffraction", Ultramicroscopy, vol. 111, pp. 828-840, © 2010 ElsevierB.V.

(Continued)

*Primary Examiner* — Eliza W Osenbaugh-Stewart
(74) *Attorney, Agent, or Firm* — Blue Filament Law PLLC

(57) ABSTRACT

A method for automatically aligning a scanning tunneling electron microscope (STEM) for acquiring precession electron diffraction (PED) mapping data includes the generation of an incident electron beam aligned with a STEM optic axis and focused on a sample region. A non-inclined signal is acquired of the spatial distribution from the sample region, by scanning the aligned incident beam across multiple discrete locations and acquiring a signal associated with each location. The method can further include the inclination of the incident electron beam to a fixed inclination angle relative to the optic axis and then acquiring an inclined signal spatial distribution from the sample region by scanning the inclined incident beam across the multiple discrete locations while applying a cyclic azimuthal scanning pro- (Continued)

tocol to the inclined beam and acquiring a signal associated with each location. An azimuthal spatial alignment correction is determined by comparing the non-inclined and inclined signal spatial distributions.

12 Claims, 3 Drawing Sheets

(51) Int. Cl.
    *G01N 23/20058*    (2018.01)
    *H01J 37/28*    (2006.01)

(56) References Cited

OTHER PUBLICATIONS

Liao, Y. et al.; "On the alignment for precession electron diffraction", Ultramicroscopy, vol. 117, Apr. 7, 2012, pp. 1-6, © 2012 ElsevierB.V.
Own, C. et al.; "Electron precession: A guide for implementation", Review of Scientific Instruments, vol. 76, No. 3, Mar. 1, 2005, pp. 33703-1 to 33703-12, © 2005 American Institute of Physics.
Own, C.; "System Design and Verification of the Precession Electron Diffraction Technique", Ph.D. thesis, Materials Science and Engineering, Northwestern University, Dec. 2005 (available at http://www.numis.northwestern.edu/thesis/own_thesis.pdf) (Chapter 2 and Appendix E); Evanston, Illinois.
Zhang, D. et al.; "Precession electron diffraction using a digital sampling method", Ultramicroscopy, vol. 111, No. 1, Dec. 1, 2010, pp. 47-55, © 2010 Elsevier B.V.

\* cited by examiner

METHOD FOR AUTOMATICALLY ALIGNING A SCANNING TRANSMISSION ELECTRON MICROSCOPE FOR PRECESSION ELECTRON DIFFRACTION DATA MAPPING

RELATED APPLICATIONS

This application is a non-provisional application that claims priority benefit of U.S. Provisional Application Ser. No. 62/645,378 filed Mar. 20, 2018, the contents of which, including appendices thereto are incorporated herein by reference.

FIELD OF THE INVENTION

The invention, in general, relates to transmission electron diffraction and, in particular, to methods for automatically aligning a scanning transmission electron microscope (STEM) for acquisition of precession electron diffraction (PED) mapping data at high spatial resolution.

BACKGROUND OF THE INVENTION

In a STEM, an electron beam can be focused down to a diameter of less than 1 nm and scanned between discrete sample locations while acquiring one or more detector signals at each location.

The acquired signals can be used to generate a highly magnified image of the scanned sample area showing morphological, compositional and structural information.

A suitably configured two-dimensional electron detector can acquire the angular distribution of electrons scattered from the sample. Such electron diffraction (ED) data can be analyzed to determine the local structure—crystalline phase, crystal orientation, strain, degree of crystallinity, etc.—at discrete sample locations. However, in all but weakly scattering samples, such analysis is greatly complicated by dynamical electron diffraction.

The influence of dynamical diffraction can be suppressed using precession electron diffraction (PED), in which the incident beam is tilted off-axis, typically by of the order of 0.3 to 3 degrees, and rotated around the axial direction, defining a cone ideally having its apex (or referred to herein synonymously as the "pivot point") fixed on a discrete sample location. The inclination of the incident beam, averaged by azimuthal rotation, suppresses dynamical diffraction effects, while increasing the number of observable diffraction maxima, and allows PED data to be analyzed using relatively simple kinematical models.

The relative ease with which PED data can be analyzed has allowed structural determination from electron diffraction data to be automated and for the generation of maps, showing, e.g., crystal phase and orientation, based on PED data. (U.S. Pat. No. 8,253,099 to NanoMEGAS SPRL). Such PED data mapping has since been applied to a wide range of materials, particularly polycrystalline and/or multiphase materials, and to map strain in crystalline, polycrystalline and/or multiphase materials.

Acquisition of PED data mapping, however, places great demands on instrument performance, since only small deviations from an ideal precession cone, caused by minor misalignments, can significantly increase the effective size and alter the position of the incident beam on the sample, and so degrade the resolution and accuracy of the resulting PED data map. Lengthy alignment procedures can also render PED data mapping prohibitively slow.

U.S. Pat. No. 8,253,099 describes manual and automated procedures for aligning a TEM with STEM capabilities for PED data mapping. In the manual procedure, the user adds empirically-derived signals to those that drive beam precession, in order to minimize erratic movement of the beam observed in a highly magnified TEM image (col. 12, lines 30 to 39). In the automated procedures, signals are added to minimize movement of the magnified beam in TEM imaging mode as the incident beam rotates around the precession cone (col. 12, lines 40 to 64).

However, due to optical aberrations, the image of the beam incident on a sample, as observed in TEM imaging mode on the final detector, does not necessarily have the same shape or location as the actual beam at the sample, so the alignment procedures in U.S. Pat. No. 8,253,099 that rely on imaging the beam on the sample are inherently limited.

Barnard et al., 174 Ultramicroscopy 79-88 (2017), describe a method for manually aligning a conventional STEM instrument for high resolution PED mapping in diffraction mode, aiming at ensuring the pivot point coincides with the sample, relying on user observation of a shadow image of a highly-visible sample feature in a bright-field convergent-beam ED disk (Sec. 3.1, pages 81 to 82).

Sensitivity to misalignment only increases as the capabilities of STEM instruments with PED data mapping are expanded, by accessing larger precession tilt angles, faster scan rates between discrete sample locations, and smaller incident beam diameters. For example, a recently developed STEM instrument is capable of applying precession angles of up to around 2 degrees, scanning the incident beam between discrete locations at a rate of more than 1000 points/sec and focusing an incident beam to a diameter of around 1 nm. (EP 17000450.1, EP 17000451.9, EP 17000452.7 and EP 17000453.5). As another example, WO 2017/087045 A1 (Integrated Dynamic Electron Solutions, Inc.) discloses a STEM-capable instrument configured for acquisition of diffraction data over short time periods, albeit without implementation of PED capabilities.

It would be advantageous to develop a method for automatic alignment of a PED-capable STEM for rapid acquisition of PED mapping data at high spatial resolution.

OBJECT OF THE INVENTION

It is an object of the present invention to provide methods for automatically aligning a STEM for acquisition of PED mapping data at high spatial resolution.

It is another object of the present invention to avoid the above-mentioned disadvantages of the above methods for aligning a STEM to acquire PED mapping data.

It is a further object of the invention to provide an alternative to the prior art.

SUMMARY OF THE INVENTION

Thus, the above-described objects and several other objects are intended to be obtained in a first aspect of the invention by providing a method for automatically aligning a STEM for acquiring PED mapping data, the method includes generating an incident electron beam aligned with the optic axis of the STEM and focused on a region of a sample; and, acquiring an non-inclined signal spatial distribution from the sample region, by scanning the aligned incident beam across multiple discrete locations of the sample region and acquiring from at least one electron detector a signal associated with each location. The method in the first aspect of the invention in some embodiments also includes: inclining the incident electron beam to a fixed inclination angle with respect to the optic axis; acquiring an inclined signal spatial distribution from the sample region by scanning the inclined incident beam across the multiple discrete locations while applying a cyclic azimuthal scanning protocol to the inclined beam and acquiring from the at least one electron detector a signal associated with each location; and determining an azimuthal spatial alignment correction by comparing the non-inclined and inclined signal spatial distributions.

A STEM (or Scanning Transmission Electron Microscope) means an electron optical instrument capable of scanning a focused electron probe across multiple sample locations while acquiring signals of transmitted electrons from one or more detectors, either a dedicated STEM instrument adapted to apply precession, or a TEM instrument adapted to function as a STEM and apply precession.

PED mapping data means data extracted from a set of PED patterns acquired across multiple locations of a sample region that is suitable for generating a spatial map of the properties of that sample region, such as degree of crystallinity, phase, orientation, strain.

Automatic alignment means performing the alignment method entirely without, or with minimal, intervention by the user of the STEM instrument.

The advantages of automatic alignment include increased speed and reproducibility when compared to manual alignment, even if performed by a skilled user, and lower cost, by the freeing time of a skilled user and obtaining more PED mapping data more rapidly from an expensive STEM instrument.

An incident beam focused on the sample means an incident beam having the general form of an inverted solid cone disposed to intersect the sample at substantially the cone apex.

Scanning the incident beam across multiple discrete locations of the sample region means alighting the beam on each of the multiple discrete locations long enough time period to allow acquisition of a signal from at least on electron detector. The incident beam may be moved between each discrete location with or without blanking, as needed.

Discrete locations mean locations that are separate and distinct. The traces of an incident beam impinging on adjacent discrete locations may, in some circumstances, partially overlap, such as when generating mapping data at high spatial resolution of the order of the focused probe diameter, particularly when the beam is initially inclined and before completion of the alignment.

Acquiring from at least one electron detector a signal associated with each location means acquiring a signal from at least one electron detector while the incident beam is situated at that location.

A signal from an electron detector means a signal measured by an electron detector yielding a value relatable to the number of scattered electrons collected by the detector in the time interval during which the incident electron beam is situated on a given location, possibly limited to the number of collected electrons falling within a given angular range. The measured signal is preferably related linearly to the number of electrons collected by the detector.

A non-inclined signal spatial distribution is the spatial distribution of the signals obtained with the non-inclined incident beam from the multiple discrete locations of the sample region.

A non-inclined incident beam means a conical incident beam whose principal axis at each discrete location is incident on the sample parallel to the optical axis.

An inclined signal spatial distribution is the spatial distribution of the signals obtained with the inclined incident beam from the multiple discrete locations of the sample region.

An inclined incident beam means a conical incident beam whose principal axis at each discrete location is incident on the sample and not parallel to the optical axis.

A cyclic azimuthal scanning protocol means a set of continuous or incremental adjustments to the azimuthal angle of the inclined beam applied while the incident beam is scanned across the multiple discrete locations of the sample region, such that the range of azimuthal angles sampled at the multiple discrete locations of at least substantially completes at least one azimuthal cycle.

The azimuthal spatial alignment correction for a given inclination angle comprises a set of corrections applied at each azimuthal angle that effectively cancel out, or at least substantially counteract, displacement during precession of the inclined beam on the sample surface away from the position of the non-inclined beam. The component of the azimuthal spatial alignment correction applicable at a given azimuthal angle corresponds to a vector describing a direction and magnitude at the surface of the sample.

Determining an azimuthal spatial alignment correction, by comparing the inclined and non-inclined signal spatial distributions, may involve different procedures, depending on the cyclic azimuthal scanning protocol applied.

An advantage of comparing the signals acquired from a detector is that the location of the beam during the alignment procedure is maintained during subsequent acquisition of PED mapping data, since there is no need to change the configuration of post-specimen lenses after alignment is completed before acquiring PED mapping data.

In another aspect of the invention, the cyclic azimuthal scanning protocol comprises, at each discrete location, cycling the azimuthal angle through one or more cycles, such that the incident beam undergoes precession at each multiple discrete location. The number of cycles may be an integral number.

In another aspect of the invention, the cyclic azimuthal scanning protocol comprises maintaining the azimuthal angle substantially constant at each discrete location, but changing the azimuthal angle between discrete locations, such that the azimuthal angles maintained at the multiple discrete locations together substantially complete at least one azimuthal cycle.

Maintaining the azimuthal angle substantially constant at each discrete location means maintaining the azimuthal angle sufficiently constant at each discrete location long enough to allow collection of a signal from the one or more detectors characteristic of that azimuthal angle.

In another aspect of the invention, determining the azimuthal spatial alignment correction comprises: calculating an inclined signal spatial distribution by applying to the acquired non-inclined signal spatial distribution a suitably adapted trial azimuthal spatial alignment correction; comparing the calculated and acquired inclined signal spatial distributions while systematically varying the trial azimuthal spatial alignment correction; and determining the azimuthal spatial alignment correction that minimizes the difference between the calculated and acquired inclined signal spatial distributions.

A suitably adapted trial azimuthal spatial alignment correction means a candidate azimuthal spatial alignment correction adapted for application to the acquired non-inclined signal spatial distribution to allow calculation of an inclined signal spatial distribution. What constitutes a suitable adaptation will depend on the particular cyclic azimuthal scanning protocol applied to acquire the inclined signal spatial distribution.

Systematically varying includes iteratively changing the trial azimuthal spatial alignment correction according to the magnitude of the difference determined between the calculated and acquired inclined signal spatial distributions.

In another aspect of the invention, determining the azimuthal spatial alignment correction comprises acquiring a corrected inclined signal spatial distribution by applying a trial azimuthal spatial alignment correction to the inclined beam; comparing the corrected inclined signal spatial distribution with the non-inclined signal spatial distribution while systematically varying the trial azimuthal spatial alignment correction; and determining the azimuthal spatial alignment correction that minimizes the difference between the corrected inclined and non-inclined signal spatial distributions.

Systematically varying includes iteratively changing the trial azimuthal spatial alignment correction, according to the magnitude of the difference determined between the corrected inclined and non-inclined signal spatial distributions.

In another aspect of the invention, the at least one electron detector is selected from the group consisting of a BF, ADF, HAADF, SE or BSE detector.

A BF detector means a bright-field detector that collects electrons transmitted through the sample and scattered up to a given angle, typically around 0.5 degrees. An ADF detector means an annular dark field detector that collects transmitted electrons within a range of scattering angles, typically between 0.5 and 2 degrees. An HAADF detector means a high angle annular dark field detector that collects transmitted electrons within a range of higher scattering angles, typically between 3 and 10 degrees. A SE detector means a secondary electron detector that collects lower energy electrons emitted from the sample, typically between 5 and 100 eV, and is typically disposed on the same side of the sample as the electron source. A BSE detector means a backscattered electron detector, which typically collects elastically-scattered electrons and electrons having an energy as low as around 100 eV, scattered typically between 135 and 180 degrees, and is located on the same side of the sample as the electron source.

BF, ADF, HAADF or BSE detector is meant to include a suitably disposed two-dimensional detector configured to function as a BF, ADF, HAADF or BSE detector, by integrating the signal from an area of the two-dimensional detector corresponding to the range of scattering angles collected by a BF, ADF, HAADF or BSE detector, respectively.

In other aspects of the invention, the multiple discrete locations are uniformly spaced along one or more parallel straight lines or are uniformly spaced along one or more straight lines perpendicular to the parallel straight lines.

In another aspect of the invention, the method further comprising acquiring PED mapping data, including from at least a fraction of the multiple discrete locations used in the alignment.

The advantage of acquiring PED mapping data from at least a fraction of the same multiple discrete locations used in the alignment method is that the STEM imaging conditions change only minimally between alignment and acquisition of PED mapping data, thus increasing the likelihood that the alignment will be preserved during PED mapping data acquisition.

In another aspect of the invention, the method further comprising: during the acquisition of the PED mapping data also acquiring from at least a fraction of the mapped locations a reference signal from at least one electron detector that is selected from the group consisting of a BF, ADF, HAADF, SE or BSE detector and not used for acquisition of the PED mapping data; and using the acquired reference signals to verify the spatial alignment of the multiple discrete locations at which PED mapping data is acquired.

The advantage of acquiring a reference signal at the same time as the PED mapping data is that the reference signal allows verification of the spatial alignment of the PED mapping data.

BRIEF DESCRIPTION OF THE FIGURES

To the extent that the figures show different ways of implementing the present invention they are not to be construed as limiting to other possible embodiments falling within the scope of the attached claim set.

DETAILED DESCRIPTION

Effective PED mapping requires maintaining an incident beam undergoing precession effectively stationary at each of a multitude of discrete locations distributed accurately across a region of the sample. As the diameter of the focused beam is decreased, and as the spacing between and number of discrete locations is increased, the need to correctly align a STEM instrument implementing PED mapping only increases, as the sensitivity to misalignment increases. The following alignment method may be performed on a STEM of the type described in EP 17000450.1, EP 17000451.9, EP 17000452.7, EP 17000453.5, but may also be performed on any other TEM instrument having suitable STEM and precession capabilities.

Figure 1:
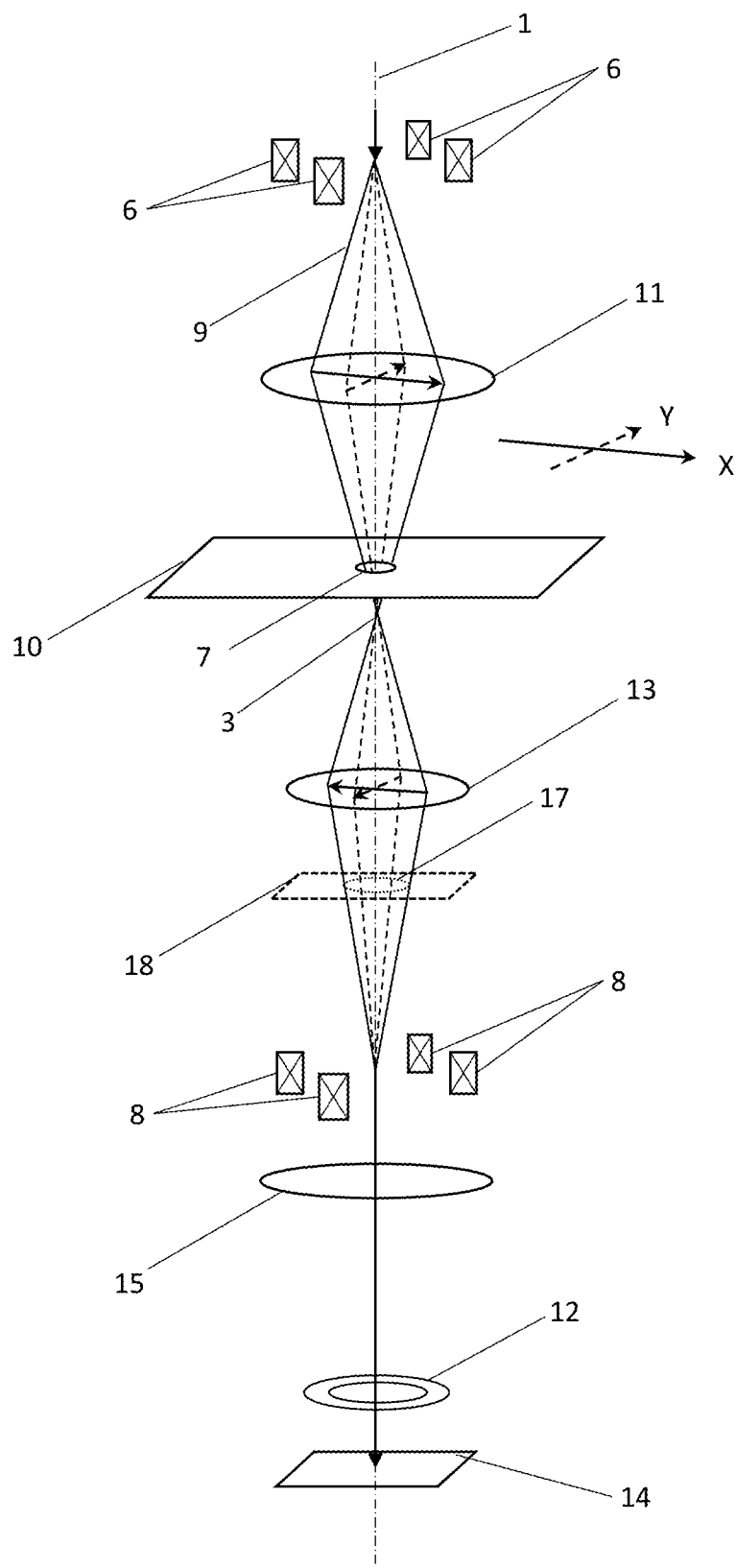
FIG. 1 is a schematic representation of the layout of a STEM instrument used for acquisition of PED mapping data.

FIG. 1 is a schematic representation of part of the layout of a STEM instrument suitable for acquisition of PED mapping data and for performing the alignment method described herein.

Inclination and scattering angles, notional electron paths, and sizes and distances between STEM components, are not to scale, and not all components of a STEM instrument are shown. In FIG. 1, the electron beam is shown originating vertically above sample 10, with components shown, and described in the following, as disposed above and below the sample. However, as a general matter, a STEM column may assume different physical orientations in a STEM instrument, including such that the electron beam originates vertically below the sample.

An electron beam generated by an electron source (not shown), typically having an energy between 20 to 300 keV, passes through pre-field objective lens 11, sample 10, post-field objective lens 13, and projector lens 15, before impinging on two-dimensional ("2D") detector 14. The electrons transmitted though sample 10 are scattered with an angular distribution characteristic of the local structure of the sample, forming an electron diffraction ("ED") pattern in a back focal plane 18 of the post-field objective lens 13. Projector lens 15 is shown configured to project the ED formed in back focal plane 18 onto two-dimensional detector 14. For a parallel electron beam incident on a defect-free crystalline location of the sample, to a first approximation, the ED pattern will consist of point-like maxima.

An ADF/HAADF detector 12 may also be introduced between projector lens 15 and two-dimensional detector 14, as may a BF detector (not shown in FIG. 1). SE and BSE detectors (not shown in FIG. 1) may also be located above sample 10.

FIG. 1 also shows precession coils 6, disposed above pre-field objective lens 11, and de-precession coils 8, disposed below post-field objective lens 13, that apply precession motion to the incident beam and remove precession motion from the beams transmitted through the sample, respectively. Four precession coils, arranged in the same plane in orthogonal opposing pairs, are shown in the schematic, configured to control the inclination θ and azimuthal angle φ of incident beam 9. Precession coils 6, when, for example, forming part of a double stage deflection system, may also be used to scan the incident beam across different sample locations, or in other instrument configurations, the scanning across different locations may be implemented using a separate set of scanning coils (not shown) Likewise, de-precession coils 8 may perform a de-scanning function, or that function may be performed by another set of deflection coils (not shown).

In FIG. 1, incident beam 9, undergoing precession, as shown by four lines disposed at equal azimuthal intervals on the surface of an inverted cone with its apex disposed adjacent to precession coils 6, is focused by pre-field objective lens 11 onto sample 10, forming a precession cone, again shown by the four lines disposed at equal azimuthal intervals on its surface, with the precession cone apex, or pivot point, 3 ideally formed adjacent to sample 10. However, the precession cone is not correctly aligned, since pivot point 3 lies underneath sample 10, leading to ring-shaped trace 7 across the surface of sample 10, executed as incident beam 9 completes an azimuthal cycle.

As a consequence of the precession motion of incident beam 9, the diffraction pattern formed in back focal plane 18, as opposed to a point-like maxima characteristic of a more or less parallel beam not undergoing precession, or a circular maxima, characteristic of a convergent incident beam not undergoing precession, traces a ring-shape 17. Though not shown in FIG. 1, the diffraction maxima constituting the PED may take the form of overlapping ring-shapes, depending on the relative magnitude of the inclination and scattering angles.

Notwithstanding the misalignment of pivot point 3 with regard to sample 10, to the extent precession motion is removed by de-precession coils 8 from electrons transmitted through sample 10, the PED pattern formed by projector lens 15 on 2D detector 14 again shows point-like diffraction maxima.

Figure 2:
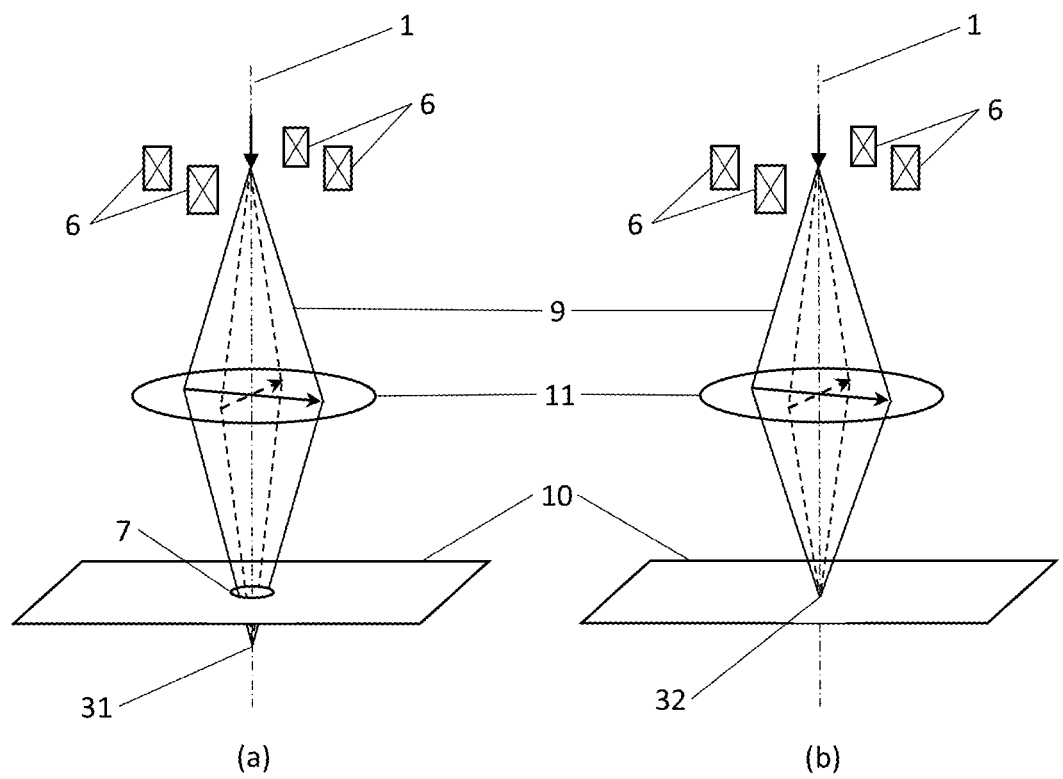
FIG. 2 is a schematic representation of an incident beam undergoing precession on a sample region with the pivot point (a) misaligned and (b) aligned.

FIG. 2 is a schematic representation of an incident beam undergoing precession at a sample surface. As in FIG. 1, the angles and locations and sizes of features are not to scale. FIG. 2(a) shows incident beam 9 undergoing precession but misaligned such that that pivot point 31 is disposed below sample 10. As a consequence, incident beam 9 traces a ring-shape 7 on the surface of sample 10, as in FIG. 1. Though not shown, misalignment can also lead to pivot point 31 being disposed above sample 10. When so misaligned, even if incident beam 9 were to execute a perfectly symmetrical precession cone, driven by precession coils 6, and beams transmitted through the sample were perfectly free of precession motion, removed by the de-precession coils (B in FIG. 1), the resolution of the resulting PED map would still be compromised by the ring-shaped movement of the incident beam across the surface of sample 10.

FIG. 2(b) shows correct precession alignment, with pivot point 32 coincident with sample 10, such that incident beam 9 remains fixed at a given location on the sample during precession while a PED pattern is collected from that location, and the spatial resolution of mapping data collected with precession is not degraded by displacement of the incident beam during execution of each azimuthal cycle.

Figure 3:
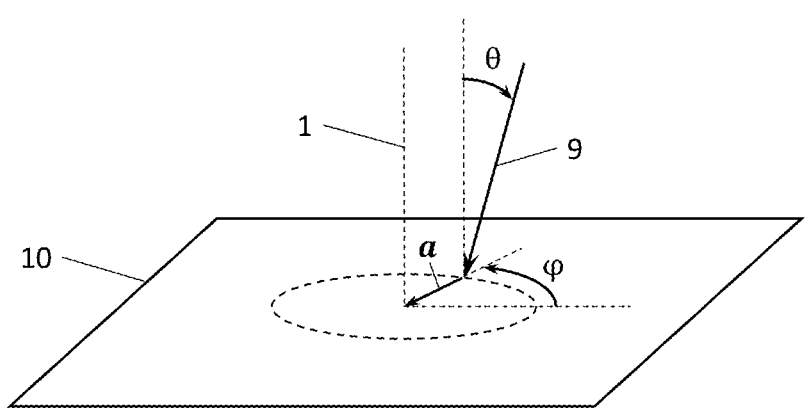
FIG. 3 is a schematic showing the sample surface geometry of a misaligned incident beam undergoing precession.

FIG. 3 shows the geometry of precession misalignment, indicating the precession or fixed inclination angle θ, the angle by which incident beam 9 is inclined with respect to the optic axis during precession, the azimuthal angle φ at a particular instant, and the corresponding component of the azimuthal spatial alignment correction, vector a on the surface of sample 10 that returns the beam undergoing precession to the location of the beam without implementation of precession. The inclination angle θ, typically between about 0.3 and 3 degrees, is exaggerated for clarity.

Deviations from the idealized precession cone geometry shown in FIG. 3 may also cause the incident beam to move away from a given discrete sample location during completion of a precession cycle and increase the effective size of the incident beam, when averaged over one or more precession cycles. To the extent they are present, such deviations in the locations of the incident beam on the sample may be also be corrected using the precession alignment method described herein.

As an initial stage in the alignment of a STEM instrument for acquisition of PED mapping data, the incident electron beam is aligned along the optic axis of the STEM instrument and focused on a sample region.

A non-inclined signal spatial distribution is acquired from the sample region, by scanning the aligned, and non-inclined, incident beam across multiple discrete locations of the sample region while acquiring from at least one electron detector a signal associated with each location.

The incident beam is inclined to a fixed inclination angle with respect to the optic axis, the inclination angle selected as appropriate for the particular PED mapping application envisaged, and an inclined signal spatial distribution acquired from the sample region, by scanning the inclined incident beam across the same multiple discrete locations while applying a cyclic azimuthal scanning protocol to the inclined beam and acquiring from the at least one electron detector a signal associated with each location.

As the inclined or non-inclined beam is scanned across the multiple discrete sample locations, the incident beam may be blanked, to avoid exciting a signal from the sample regions outside the discrete locations, or the one or more electron detectors may be configured to not accept the signal while the incident beam is between discrete locations.

The cyclic azimuthal scanning protocol is a set of continuous or incremental adjustments to the azimuthal angle of the inclined beam applied while the incident beam is scanned across the multiple discrete locations of the sample region, such that the range of azimuthal angles sampled as the incident beam is scanned across the multiple discrete locations at least substantially completes at least one azimuthal cycle.

Figure 4:
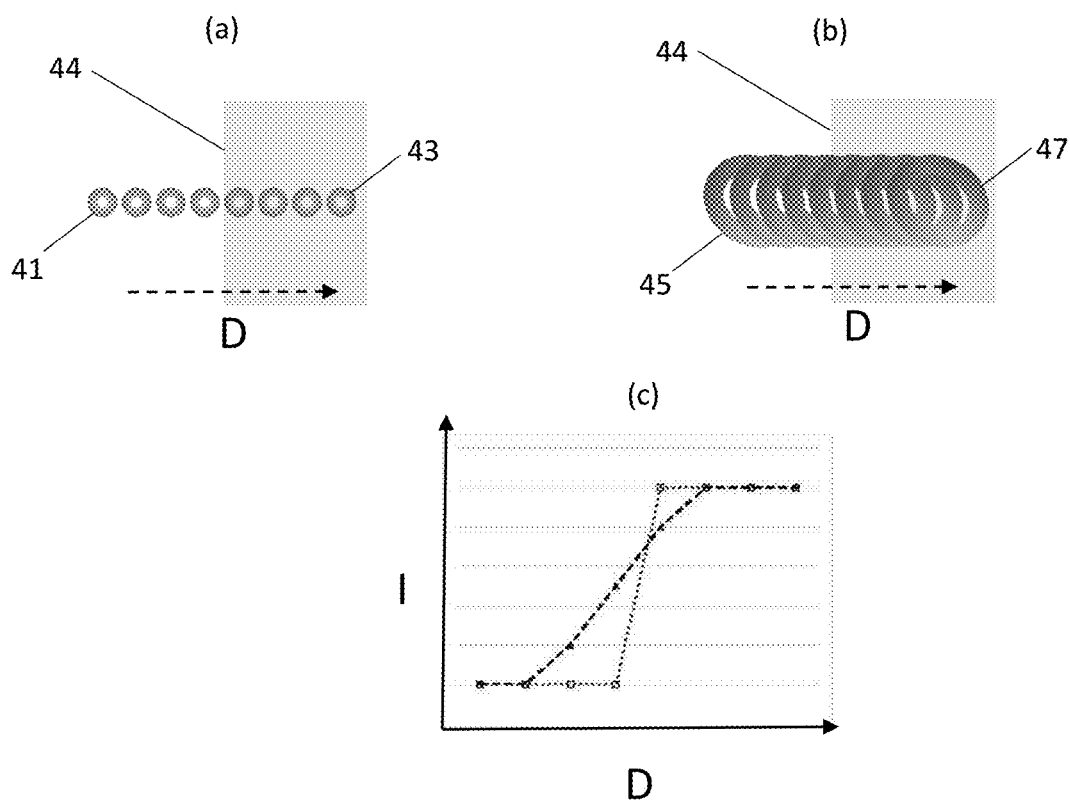
FIG. 4 is a schematic representation of an alignment method for PED mapping, showing: (a) the traces on a sample surface of a non-inclined incident beam scanned across discrete locations equally spaced on a straight line crossing an interface; (b) the traces of a misaligned incident beam undergoing precession scanned across the same locations; and (c) a plot of STEM signal intensities acquired using the non-inclined beam and the beam undergoing precession.

FIG. 4 schematically represents an example of the alignment method described herein in which the cyclic azimuthal scanning protocol comprises, at each discrete location, cycling the azimuthal angle $\varphi$ through one or more complete cycles, such that the incident beam undergoes precession at each multiple discrete location. The number of complete cycles executed at each discrete location will depend on the azimuthal angular speed of the incident beam and dwell time, the time interval during which the incident beam is situated on each location.

FIG. 4(a) is a schematic representation of a plan view of an area of a sample surface during a stage in the alignment procedure, showing a time sequence in which an incident beam, aligned with the optic axis but not inclined, is focused on multiple discrete sample locations spaced equidistantly long a straight line, running in direction D as indicated by a dashed arrow. The straight line intersects a rectangular portion 44 of the sample having a structure different from its surroundings, for example, a different orientation and/or phase, representative of the type of features distributed within in a sample of interest for PED mapping. Such features in a real sample need not, of course, be rectangular, nor have straight boundaries, and the path of the incident beam need not be expected to intersect such boundaries at normal incidence, as shown in FIGS. 4(a) and (b). The traces of the incident beam, indicating the discrete locations of the sample from which a signal from at least one electron detector is acquired, are indicted by the shaded circles, starting at 41, ending at 43.

FIG. 4(b) shows a schematic representation of a plan view of the same sample surface area during a stage in the alignment procedure, again showing a time sequence, in which the incident beam is again focused on notionally the same multiple discrete sample locations as in FIG. 4(a), spaced equidistantly long a straight line running in direction D.

The incident beam is now, however, inclined by a fixed angle and a cyclic azimuthal scanning protocol is applied, such that the azimuthal angle $\varphi$ executes one or more cycles at each of the multiple discrete locations. As a consequence of the application of the cyclic azimuthal scanning protocol, and of a misalignment of the pivot point away from the sample, the traces of the incident beam have expanded, as indicated by the sequence of shaded overlapping ring-shapes, starting at 45 and ending at 47.

FIG. 4(c) plots, along the vertical axis, intensity I, in arbitrary units, of a signal acquired from at least one electron detector under the conditions shown in FIG. 4(a) and FIG. 4(b), as a function of distance along direction D. Portion 44, having a different structure form its surroundings, is shown as generating a more intense signal than its surroundings.

The squares, connected with the dotted lines, plot the intensity for the non-inclined beam, which show a relatively steep increase in intensity as the circular locations sampled by the incident beam enter portion 44. In contrast, the triangles, connected by the dashed line, show a more gradual increase, as the overlapping rings enter portion 44.

In general, independent of the cyclic azimuthal scanning protocol applied, a single linear scan may be insensitive to misalignments occurring away from the line scanned during the alignment procedure. For example, in the event that the sample surface normal is not aligned parallel to the optic axis, but the scanned straight line is nevertheless perpendicular to optic axis, sample locations to one side of the scanned straight line will be disposed below the pivot point, in proportion to their perpendicular distance from the scanned line, while sample locations to the other side of the scanned line will be disposed above the pivot point, in proportion to their perpendicular distance from the scanned line.

A single line of discrete locations may be augmented by scanning across additional discrete locations, possibly forming a series of parallel lines, such that the multiple discrete locations form a grid on the sample region. The order in which the multiple discrete locations comprising the grid are scanned may also be varied. For example, when the grid corresponds to a regularly spaced parallel lines, the multiple discrete locations may be scanned following a raster pattern.

In general, independent of the cyclic azimuthal scanning protocol applied, the number, relative disposition and spatial extent of the locations used for the alignment may be varied, depending on the specific requirements of the sample and the envisaged PED mapping application. The multiple discrete locations need not be spaced regularly nor a form a symmetrical geometric figure.

In any event, the signals acquired from the multiple discrete locations with a non-inclined beam correspond to a non-inclined signal spatial distribution, while the signals acquired with the inclined beam and azimuthal spatial alignment correction correspond to an inclined signal spatial distribution.

Independent of the particular cyclic azimuthal scanning protocol applied, and the methods used to compare inclined and non-inclined spatial distributions described below, the overall sequence of the steps in the alignment method described herein may be varied. For example, the inclined signal spatial distribution may be acquired before the non-inclined signal spatial distribution. It is also possible to acquire at least a fraction of the non-inclined and inclined beam signal spatial distributions discrete location by discrete location, by inclining the beam and applying the relevant part of the cyclic azimuthal scanning protocol at a given subset of the multiple discrete locations, rather than inclining the incident beam between acquiring the entire inclined and entire non-inclined signal spatial distributions.

The object of the PED mapping alignment method described herein—determination of the azimuthal spatial alignment correction comprising the set of corrections to be applied at each azimuthal angle that effectively cancel out displacement during precession of the inclined beam on the sample surface away from the position of the non-inclined beam—may involve comparing the non-inclined and inclined signal spatial distributions following a variety of methods.

The alignment may be accelerated, by determining, only a fraction, possibly only one, of the components of the azimuthal corrections comprising the azimuthal spatial alignment correction, with the remainder of the components interpolated numerically or extrapolated during PED mapping.

In certain methods, determining the azimuthal spatial alignment correction may involve iteratively acquiring inclined signal spatial distributions, each successively corrected by applying a trial azimuthal spatial alignment correction. In such group of methods, by comparing each corrected inclined signal spatial distribution with the non-inclined signal spatial distribution, while systematically varying the trial azimuthal spatial alignment correction, the azimuthal spatial alignment correction that minimizes the difference between the corrected inclined and non-inclined signal spatial distributions can be determined.

In a variation on these methods, determining the azimuthal spatial alignment correction may involve iteratively acquiring non-inclined signal spatial distributions, each successively deviated by applying a trial azimuthal spatial alignment correction. By comparing each deviated non-inclined signal spatial distribution with the inclined signal spatial distribution, while systematically varying the trial azimuthal spatial alignment correction, the azimuthal spatial alignment correction that minimizes the difference between the deviated non-inclined and inclined signal spatial distributions can be determined.

Such methods, based on iterative acquisition of corrected trial inclined or non-inclined signal spatial distributions, may be implemented using different cyclic azimuthal scanning protocols.

Other methods may involve comparing only a pair of acquired signal spatial distributions, inclined and non-inclined, by successively calculating one signal spatial distribution using a trial azimuthal spatial alignment correction appropriately applied to the other signal spatial distribution.

For example, when the cyclic azimuthal scanning protocol is of the type represented in FIG. 4, in which the incident beam executes one or more azimuthal cycles at each multiple discrete location, inclined signal spatial distribution $S_p^c(x,y)$ may be calculated from non-inclined signal spatial distribution $S_n(x,y)$ convoluted with a kernel function:

$$S_p^c(x,y) = S_n(x,y) * k(x,y)$$

where k is the convolution kernel (dependent on the alignment correction), and * denotes the convolution operation in two dimensions. The convolution kernel is defined in radial coordinates by $$k(r,\varphi) = \delta(r - a(\varphi))$$

where $\delta(r)$ is the Dirac delta function, and $a(\varphi)$ is the magnitude of the precession misalignment at azimuthal angle $\varphi$. According to this method, the azimuthal spatial alignment correction may be determined by systematic variation which minimizes the differences between calculated and acquired inclined signal spatial distributions. With reference to FIG. 4(c), the determined azimuthal spatial alignment correction would be that which results in a transformation of the non-inclined signal spatial distribution into the inclined signal spatial distribution, and the ring-shaped traces in FIG. 4(b), running from 45 to 47, to have the location and apparent diameter of the circles in FIG. 4(a), running from 41 to 43.

Those methods for determining the azimuthal spatial alignment correction based on comparing only a pair of acquired signal spatial distributions, inclined and non-inclined, by successively calculating one using a trial azimuthal spatial alignment correction applied to the other, may be implemented using cyclic azimuthal scanning protocols other than of the type shown in FIG. 4.

Figure 5:
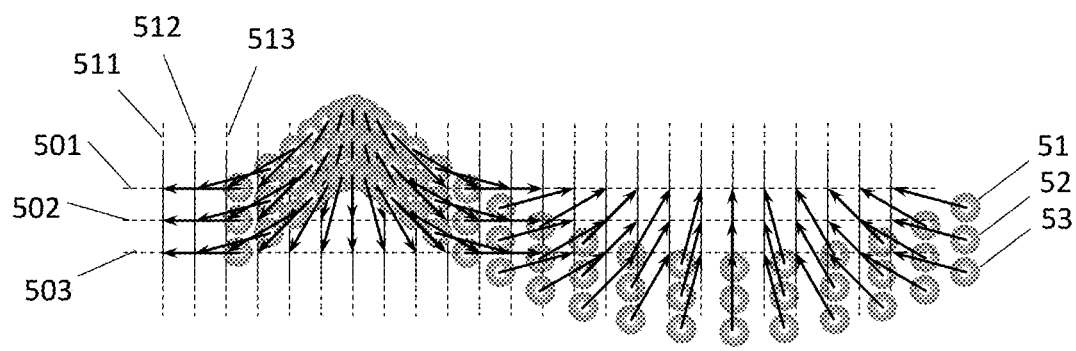
FIG. 5 is a schematic representation of an alignment method for PED mapping, showing the traces of a misaligned inclined incident beam sampling a complete cycle of azimuthal angles as it is scanned across at equally spaced discrete locations along a set of parallel lines.

FIG. 5 schematically represents a plan view of a sample during PED alignment for which the cyclic azimuthal scanning protocol comprises maintaining the azimuthal angle substantially constant at each discrete location, but changing the azimuthal angle between discrete locations, such that the azimuthal angles maintained at the multiple discrete locations together substantially complete at least one azimuthal cycle.

The multiple discrete locations are located at the intersections between parallel lines 501, 502 and 503 and perpendicular lines 511, 512 and 513, and form a rectilinear evenly spaced grid pattern. For clarity, the traces of the non-inclined incident are not shown. The shaded circles, e.g., 51, 52 and 53 on the right hand side of the figure, represent the traces of the inclined incident beam as it is scanned across the sample region while applying the cyclic azimuthal scanning protocol. The arrows represent the components of the azimuthal corrections applied at each azimuthal angle.

When the cyclic azimuthal scanning protocol is of the type represented in FIG. 5, the inclined signal spatial distribution is equivalent to non-inclined distribution, but with the intensity at any position in the inclined signal spatial distribution equivalent to the intensity in the non-inclined signal spatial distribution at a position equivalent to the position in the inclined signal spatial distribution shifted by the negative of the alignment correction.

$$S_p^c(x,y) = S_n(x - a_x, y - a_y)$$

Where $a_x$ and $a_y$ are the x- and y-components of the alignment correction vector at the azimuthal angle of the electron beam at position (x,y). To determine the alignment correction, the trial alignment correction may be systematically varied in order to minimize the differences between the calculated (the deviated non-inclined) and acquired inclined signal spatial distributions.

The skilled person will appreciate how, in implementing embodiments of the automated alignment method in which the azimuthal angle is maintained substantially fixed at each discrete location, it can be advantageous to utilize a sample region with sufficient contrast that the inclined signal spatial distribution exhibits characteristic information at spatial frequencies $f_s$ up to at least $f_s \approx 1/d_s$ where $d_u$ is the focused probe diameter of the non-inclined beam. Additionally, the skilled person will appreciate how it can be advantageous for the inclined signal spatial distribution to exhibit contrast up to spatial frequency $f_s$ in substantially all directions across the sample surface within in the sample region.

In embodiments of the automated alignment method in which the azimuthal angle is maintained substantially fixed at each discrete location a non-inclined signal spatial distribution $I^u$ may be acquired digitally, with the intensities of $I^u$ consist of a two-dimensional numerical array, $I^u_{ij}$, where i and j represent column and row indices, respectively. An inclined signal spatial distribution with one or more complete azimuthal angle cycles per line $I^p$ may also be acquired digitally, corresponding to another two-dimensional numerical array, $I^p_{ij}$, where i and j represent the column and row indices.

At any position in the inclined signal spatial distribution at column and row indices i and j, the misalignment $a(\varphi)$ causes the beam to intersect the specimen at a displacement $a(\varphi_{ij})$ from the equivalent position in the non-inclined signal spatial distribution. To the extent that the azimuthal angle is varied identically along each row, as shown, for example, in FIG. 5, the azimuthal angle depends only on the column index, so may be represented by $\varphi_i$.

To determine the misalignment $a(\varphi)$, a model may be selected that has discrete values $a_i=(x_i,y_i)$ where $x_i$ and $y_i$ represent the x- and y-components of the misalignment vector at each $\varphi_i$. To determine the quality of the model, an signal spatial distribution, or image consisting of i by j pixels, $I^m$, may be calculated from $I^u$ such that $$I^m{}_{ij}=I^u{}_{(i+xi)(j+yi)}$$

Since the misalignment components will generally not be an integral number of image pixels, it may in general be necessary to extract each $I^m{}_{ij}$ value by using some form of interpolation of the $I^u{}_{ij}$ values, such as nearest-neighbor, bilinear or bicubic spline interpolation. The quality of the model may then be determined by calculating some quality value from the $I^m$ and $I^p$ values, most commonly a sum of squared differences.

To determine the best model for $a(\varphi)$, the trial model may be varied systematically in order to find a best-fit model, that minimizes the difference between the $I^m$ and $I^p$ values. This may be done through any of the standard numerical optimization methods, such as Simplex or Quasi-Newton methods.

Once the best model of the misalignment has been so determined, an incident beam undergoing precession may be aligned by applying the corresponding azimuthal spatial alignment correction components that exactly offset the misalignment.

The cyclic azimuthal scanning protocol represented in FIG. 5—maintaining the azimuthal angle substantially constant at each discrete location, but changing the azimuthal angle between discrete locations, such that the azimuthal angles maintained at the multiple discrete locations together substantially complete at least one azimuthal cycle—may also be used in the methods based on iterative acquisition of corrected trial inclined or non-inclined signal spatial distributions, described above.

A non-inclined signal spatial distribution $I^u$ and an inclined signal spatial distribution $I^p$ may be acquired. $I^p$ may then be compared to $I^u$, and a quality of match determined by applying a suitable numerical algorithm, most commonly a sum of squared differences.

The trial azimuthal spatial alignment correction applied to the inclined signal spatial distribution may be varied systematically, such as using Simplex or Quasi-Newton methods, and another inclined signal spatial distribution acquired, and the quality of match to the non-inclined signal spatial distribution calculated. The systematic variation of the azimuthal spatial alignment correction may be continued iteratively, until an azimuthal spatial alignment correction that produces a best match is found.

The skilled person will appreciate how the number of discrete locations across which the incident beam is scanned during the alignment procedure may be selected according to the requirements of the particular PED mapping application, such as the diameter of the non-inclined focused incident beam on the sample, the inclination angle, and the size of the region and spatial density of locations from which PED mapping data is to be obtained. In general, the smaller the diameter of the focused non-inclined incident beam, weaker the signals from the one or more detectors, greater the inclination angle and larger the region from which PED mapping data is to acquired, the greater the sensitivity of the PED mapping to misalignment.

Depending on the length scale of interest in the sample, PED mapping data may be obtained, using a probe diameter as small as 1 nm, spaced by as little as 1 nm. Measurement time and signal strength permitting, a PED map may contain, for example, a grid of 256 by 256 locations.

Using a STEM instrument interfaced with suitable data acquisition and processing capabilities, once a sample region of interest has been identified, the methods described above may be implemented automatically with minimal user intervention. The inclined and non-inclined signal spatial distributions, generally acquired from the at least one electron detector in digital form, may be compared automatically, for example, using the iterative acquisition or calculation methods described herein, to derive the azimuthal spatial alignment correction.

In the alignment methods described herein, the at least one electron detector may be selected from the group consisting of a BF, ADF, HAADF, SE or BSE detector. FIG. 1 shows annular detector 12, an ADF or HAADF detector, depending on the angular range detected, disposed above 2D detector 14 and below projector 15. FIG. 1 shows neither a BF detector, which would typically be located in the same general region as ADF/HAADF detector 12, nor an SE detector, typically located relatively close and typically above to sample 10, nor a BSE detector, located above sample 10. BF, ADF/HAADF detector may be retractable in order to use the full frame of the 2D detector. 2D detector 14 may be configured to function as a BF, ADF or HAADF detector, by integrating the signal from an area of the two-dimensional detector corresponding to the range of scattering angles collected by a BF, ADF or HAADF detector, respectively.

The skilled person will appreciate that, under certain illumination conditions, for certain types of sample, even when the incident beam remains on the same discrete location, signal strength may vary as a function of the orientation of the incident beam and will understand the need to select a detector configurations that are insensitive to the small changes solely in beam orientation associated with inclination of the beam by tilt precession angle θ or changes in azimuthal angle $\varphi$.

PED mapping data may be acquired, after completion of the alignment method described herein, from all or a fraction of the multiple discrete locations used to perform the alignment. PED mapping data may also be acquired from discrete locations in addition to the multiple discrete locations used in the alignment method. In other words, the resulting PED data map may occupy a fraction of the area over which the alignment method was performed, may extend beyond the edges the alignment area, may overlap with the alignment area or may occupy an adjacent non-overlapping area of the sample.

The advantage of acquiring PED mapping data from at least a fraction of the same multiple discrete locations used in the alignment method is that the STEM imaging conditions change only minimally between alignment and acquisition of PED mapping data, thus increasing the likelihood that the alignment will be preserved during PED mapping data acquisition.

In order to, for example, increase the speed of the alignment procedure and acquisition of PED mapping data, it may be desirable to align the sample locations with a direction along which the incident beam will be scanned during acquisition of PED mapping data. To the extent that the PED mapping data will be acquired from discrete locations equally spaced along a straight line, in the alignment procedure, azimuthal angles may be increased by equal increments along a straight line, while acquiring PED mapping data, certain detector configurations may be employed to simultaneously acquire reference signals. For example, such reference signals may be acquired from a suitably configured ADF or HAADF detector, so long as sufficient electrons are transmitted through the detector annulus for the 2D detector to acquire PED data. The angular range that may be acquired by an ADF or HAADF, while leaving sufficient transmitted electrons to acquire PED data, will depend on factors that include the structure of the sample and the incident electron wavelength. The 2D detector may also be configured to collect an angular range corresponding to an ADF or HAADF detector, while simultaneously collecting PED data from within the annulus of the ADF or HAADF detector. An SE or BSE detector, which does not collect transmitted electrons, can also be used to acquire a reference signal while PED data is acquired from discrete locations using a two-dimensional detector.

The acquired reference signals may be used to verify the registration of the PED data map to an image of the sample reconstructed using the reference signals. The use of reference signals acquired simultaneously with PED data allows for corrections to the registration of the data map arising from, for example, instrument or sample drift during acquisition of the PED mapping data.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an", etc., should not be construed as excluding the plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method for automatically aligning a scanning transmission electron microscope (STEM) for acquiring precession electron diffraction (PED) mapping data at high spatial resolution, comprising:
   generating an incident electron beam aligned with the optic axis of the STEM and focused on a region of a sample and;
   acquiring a non-inclined signal spatial distribution from the sample region by scanning the incident beam across multiple discrete locations of the sample region while acquiring from at least one electron detector a signal associated with each location;
   further characterized by:
   inclining the incident electron beam to a fixed inclination angle θ with respect to the optic axis;
   acquiring an inclined signal spatial distribution from the sample region by scanning the inclined incident beam across the multiple discrete locations while applying a cyclic azimuthal scanning protocol to the inclined beam; and
   acquiring from the at least one electron detector a signal associated with each location; and determining an azimuthal spatial alignment correction by comparing the non-inclined and inclined signal spatial distributions.

2. The method of claim 1, wherein the cyclic azimuthal scanning protocol comprises: at each discrete location cycling the azimuthal angle through one or more of cycles.

3. The method of claim 1, wherein the cyclic azimuthal scanning protocol comprises: maintaining the azimuthal angle substantially constant at each discrete location; and changing the azimuthal angle between discrete locations such that the azimuthal angles maintained at the multiple discrete locations at least substantially complete one azimuthal cycle.

4. The method of claim 1, wherein determining the azimuthal spatial alignment correction comprises:
   calculating an inclined signal spatial distribution by applying to the acquired non-inclined signal spatial distribution a suitably inverted trial azimuthal spatial alignment correction;
   comparing the calculated and acquired inclined signal spatial distributions while systematically varying the trial azimuthal spatial alignment correction; and
   determining the azimuthal spatial alignment correction that minimizes the difference between the calculated and acquired inclined signal spatial distributions.

5. The method of claim 1, wherein determining the azimuthal spatial alignment correction comprises:
   acquiring a corrected inclined signal spatial distribution by applying a trial azimuthal spatial alignment correction to the inclined beam;
   comparing the corrected inclined signal spatial distribution with the non-inclined signal spatial distribution while systematically varying the trial azimuthal spatial alignment correction; and
   determining the azimuthal spatial alignment correction that minimizes the difference between the corrected inclined and non-inclined signal spatial distributions.

6. The method of claim 1, wherein the at least one electron detector is selected from the group consisting of a BF, ADF, HAADF, SE or BSE detector.

7. The method of claim 1, wherein the multiple discrete locations are uniformly spaced along one or more parallel straight lines.

8. The method of claim 7 wherein the multiple discrete locations are uniformly spaced along one or more straight lines perpendicular to the parallel straight lines.

9. The method of claim 1, further comprising acquiring PED mapping data.

10. The method of claim 9, wherein the PED mapping data is obtained from at least a fraction of the multiple discrete locations.

11. The method of claim 10, further comprising:
   during the acquisition of the PED mapping data also acquiring from at least a fraction of the mapped locations a reference signal from at least one electron detector that is selected from the group consisting of a BF, ADF, HAADF, SE or BSE detector and not used for acquisition of the PED mapping data; and
   using the acquired reference signals to verify the spatial alignment of the multiple discrete locations at which PED mapping data is acquired.

12. The method of claim 9, further comprising:
during the acquisition of the PED mapping data also acquiring from at least a fraction of the mapped locations a reference signal from at least one electron detector that is selected from the group consisting of a BF, ADF, HAADF, SE or BSE detector and not used for acquisition of the PED mapping data; and
using the acquired reference signals to verify the spatial alignment of the multiple discrete locations at which PED mapping data is acquired.

* * * * *